United States Patent [19]
Ta et al.

[11] Patent Number: 5,608,357
[45] Date of Patent: Mar. 4, 1997

[54] HIGH SPEED PHASE ALIGNER WITH JITTER REMOVAL

[75] Inventors: Paul Ta; Michael Cheng, both of San Jose, Calif.

[73] Assignee: VLSI Technology, Inc., San Jose, Calif.

[21] Appl. No.: 526,956

[22] Filed: Sep. 12, 1995

[51] Int. Cl.$^6$ ............... H03B 5/24; H03L 7/099; H04L 7/00; H04L 25/36
[52] U.S. Cl. ............... 331/57; 331/2; 331/173; 331/185; 375/372; 375/376
[58] Field of Search ............... 331/1 A, 2, 15, 331/17, 25, 18, 23, 57, 173, 74, 185; 360/51, 8, 15; 385/372, 376, 371, 373–375; 327/156–159, 365, 379, 387, 388

[56] References Cited

U.S. PATENT DOCUMENTS

| | | | |
|---|---|---|---|
| 4,392,234 | 7/1983 | Maruta | 375/372 |
| 4,410,917 | 5/1992 | Newdoll et al. | 360/15 |
| 4,623,805 | 11/1986 | Flora et al. | 307/602 |
| 4,637,018 | 1/1987 | Flora et al. | 371/1 |
| 4,756,011 | 7/1988 | Cordell | 375/118 |
| 4,773,085 | 9/1988 | Cordell | 375/120 |
| 4,821,296 | 4/1989 | Cordell | 375/119 |
| 4,821,297 | 4/1989 | Bergmann et al. | 375/120 |
| 4,839,907 | 6/1989 | Saneski | 375/113 |
| 4,841,551 | 6/1989 | Avaneas | 375/118 |
| 4,896,337 | 1/1990 | Bushy, Jr. | 360/51 X |
| 5,081,655 | 1/1992 | Long | 375/119 |
| 5,113,418 | 5/1992 | Szczepanek et al. | 375/372 |
| 5,276,688 | 1/1994 | Urbansky | 375/372 X |
| 5,278,873 | 1/1994 | Lowrey et al. | 375/118 |
| 5,365,381 | 11/1994 | Scheffler | 360/15 |
| 5,418,496 | 5/1995 | Ford et al. | 331/2 |
| 5,452,010 | 9/1995 | Doornink | 375/372 X |
| 5,465,075 | 11/1995 | Yaklin | 331/57 X |
| 5,479,457 | 12/1995 | Waters | 375/372 |
| 5,491,456 | 2/1996 | Kay et al. | 331/173 X |

OTHER PUBLICATIONS

Bagheri et al., "11.6 GHZ 1:4 Demultiplexer with Bit–Rotation Control and 6.1Ghz Auto–Latching Phase–Aligner IC's," Digest of Technical Papers, Feb. 1992, IEEE International Solid State Circuits Conference, pp. 94–95.

Bagheri et al., "11.6 GHZ 1:4 Regenerating Demultiplexer with Bit–Rotation Control and 6.1Ghz Auto–Latching Phase–Aligner IC's Using AlGaAs/GaAs HBT Technology", IEEE Journal of Solid State Circuits vol. 27, No. 12, Dec. 1992, pp. 1787–1793.

Cordell, Robert R., "A 45–Mbit/s CMOS VLSI Digital Phase Aligner", IEEE Journal of Solid–State Circuits, vol. 23, No. 2, Apr. 1988, pp. 323–328.

Primary Examiner—David Mis
Attorney, Agent, or Firm—Hickman Beyer & Weaver

[57] ABSTRACT

A data retiming system for retiming incoming data and eliminating jitter is described. The data retiming system includes a local clock; a phase aligner for receiving the incoming data and producing a recovered clock from the incoming data, and then producing retimed incoming data by retiming the incoming data with the recovered clock; and a buffer memory for removing jitter from the retimed incoming data by storing the retimed incoming data to the buffer memory in accordance with the recovered clock and reading the stored data from the buffer memory in accordance with the local clock. The data retiming system provides reliable operation even at very high data rates. A freezeable voltage-controlled oscillator for producing a clock signal in accordance with a freeze signal and a frequency control signal is also disclosed. Using current steering techniques, the freezeable voltage-controlled oscillator is able to freeze its output very quickly.

32 Claims, 10 Drawing Sheets

HIGH SPEED PHASE ALIGNER WITH JITTER REMOVAL

BACKGROUND OF THE INVENTION

1. Field of the Invention

The present invention relates to a phase aligner, and more particularly, to a phase aligner that receives incoming data and outputs retimed data in accordance with a recovered clock signal.

2. Description of the Related Art

High speed digital logic systems frequently run in a coherent manner, that is, a clock signal is distributed throughout the system to control the timing of system operation. When such systems run at high speeds, timing skew can occur between the clock signal and the data. Timing skew is a misalignment of the clock and data phases from the desired alignment. For example, data transitions are usually said to occur during the portion of the clock cycle displaced from the clock transitions by a predetermined amount $\Delta\phi$ (delta phi). This is to allow data switching to complete before a clock transition occurs so that there is no ambiguity in detection of the data transition and so that undesirable metastable logic states do not occur. When timing (clock) is present, the $\Delta\phi$ becomes larger or smaller than desired. If this differing $\Delta\phi$ is left uncorrected, serious data transmission and data processing errors may occur.

Further, in other systems, when the data is transmitted to another portion of a circuit board or across wires to another part of the digital logic system, the clock is typically not transmitted because it produces a substantial amount of high frequency noise. Instead, the portion of the digital logic system receiving the incoming data first recovers the clock from the incoming data and then retimes the data so that the phases are displaced by the appropriate amount $\Delta\phi$.

Timing skew is particularly severe where data and clocks are transmitted to different parts of a digital logic system over different distances and where the various parts of the system are at different temperatures. Under these circumstances, the data and the local clock phases may be misaligned and/or vary with time or temperature. It is not uncommon for the variation in phases between the data and the local clock to change dynamically. The local clock is the clock signal present on the part of the system of interest and may be a distributed form of the system clock or a locally generated or regenerated clock or a clock produced in some other way that is coherent with the system clock. Dynamic phase skews are also referred to as phase jitter.

Timing adjustments are used to compensate for the timing or phase skew. One way to correct the skew is to measure the phase difference between the data and the local clock and then provide timing adjustments. In the past, these timing adjustments have been provided by different lengths of coaxial cable which were used to equalize the propagation time. Such an arrangement of coaxial cable is not only ackward, but costly. This technique is difficult to use over a broad range of frequencies and is unable to compensate for dynamic skew, that is, phase errors that change with time, temperature, etc. Another approach to provide timing adjustments is to use a quartet sampler or other circuitry which produces quadrature clocks. However, producing the quadrature clocks is difficult, and becomes more difficult as the operating frequency increases.

FIG. 1 is a generalized block diagram of a conventional phase aligning system 100. The phase aligning system 100 includes a phase aligner 102 which receives incoming data 106 and a local clock 104. The phase aligner 102 operates to produce retimed data 108 and it associated clock 110 using the incoming data 106 and a local clock 104.

There are a variety of known schemes that have been used to perform the operations associated with the phase aligner 102 shown in FIG. 1. Examples of these known phase alignment schemes are described in U.S. Pat. Nos. 5,278,873; 5,081,655; 4,821,297; 4,773,085; 4,756,011; 4,821,296; 4,841,551; 4,839,907; 4,623,805 and 4,637,018.

FIG. 2 is a block diagram of a conventional phase aligner 102. The phase aligner 102 uses quadrature clocks which are offset from a local clock 104 by a certain phase difference. A phase detector 200 receives a feedback signal and the local clock 104. Based on the difference between the phase of these two signals, the phase detector 200 produces an output signal which is filtered by low-pass filter 201 to control a voltage-controlled oscillator (VCO) 202. The VCO 202 produces four quadrature clock signals $\phi1$, $\phi2$, $\phi3$ and $\phi4$, as well as the feedback signal. The quadrature clock signals are typically $\phi(0)$, $\phi(90)$, $\phi(180)$, and $\phi(270)$, where the number contained within the parentheses refers to the phase of the clock signal. The frequencies of the quadrature clocks are all the same frequencies as the local clock 104. The quadrature clock signals are supplied to a sample & encode unit 204 and a multiplexer (MUX) 206. The sample & encode unit 204 receives the incoming data, and based on the transitions of the incoming data, determines which of the four quadrature clocks most closely aligns with the phase of the incoming data. More specifically, the sample & encode unit 204 samples the incoming data using the four quadrature clocks and then encodes the sampled signals to determine which of the four quadrature clocks has the most desirable phase such that the incoming data would be closely aligned with the particular quadrature clock. The sample & encode unit 204 produces an output signal which is sent to a select input of the MUX 206. The MUX 206 then selects the one of the quadrature clocks that the sample & encode unit 204 has determined is most appropriate. The clock output from the MUX 206 is then used to clock the incoming data 106 into the flip-flop 208. The output of the flip-flop 208 is the retimed data 108.

The phase aligner 102 as shown in FIG. 2 is troublesome to manufacture because the incoming data and the quadrature clocks are asynchronous and metastable states are very likely to occur in the sample & encode unit 204, especially during high frequency operation. Metastable states are ambiguities caused by sampling the signal at its transition point which cause the digital data to get stuck between logic states. When metastable states occur, other digital logic will often see a glitch caused by the metastable state going from its metastable condition to its stable logic state. The metastability problem worsens as the operating frequency increases because less time is available for the sample & encode unit 204 to produce a stable output. Consequently, manufacturing the phase aligner 102 requires a lot of manufacturing data to confirm that metastable states will not cause a loss of data.

Due to differences in the geometric layout of the data signal and the clock signal traces at the printed circuit board or back plane level and due to the fact that the data may have different sources, there is an unknown phase offset between the clock and the data. This phase offset, although generally relatively fixed, may be time varying for numerous reasons (e.g., temperature). As the digital networks (i.e., telecommunications networks) evolve to support higher speeds and synchronous architectures, the greater the difficulties of effectively and economically bringing numerous digital channels (asynchronous data with known average frequency but unknown phase) into phase alignment for subsequent synchronous processing. The resulting advantages of phase alignment are that clocks need not be routed with data, precise matching of transmission line lengths is not required, and switches and multiplexers operate more reliably from a single master clock. Hence, the availability of an inexpensive means of phase alignment can simplify the architecture of new systems and can substantially reduce cost.

Thus, there is a need for a phase aligner which can be reliably manufactured without the difficulties associated with metastable states.

SUMMARY OF THE INVENTION

Broadly speaking, the invention is a phase aligning system which retimes data and eliminates jitter. The invention initially accurately retimes the incoming data using a clock which is precisely recovered from the incoming data, and then removes any jitter from the retimed data. The phase aligner system can not only operate very precisely but also can be reliably manufactured without the metastability problems associated with conventional designs. There are several aspects to the invention.

In a first aspect of the invention, a data retiming system for retiming incoming data includes a local clock; a phase aligner for receiving the incoming data and producing a recovered clock from the incoming data, and then producing retimed incoming data by retiming the incoming data with the recovered clock; and a buffer memory for removing jitter from the retimed incoming data by storing the retimed incoming data to the buffer memory in accordance with the recovered clock and reading the stored data from the buffer memory in accordance with the local clock.

Preferably, the phase aligner associated with the data retiming system associated with the first aspect of the invention includes a phase detector for comparing the local clock with a feedback signal and producing a control signal based on the comparison; a master voltage-controlled oscillator for receiving the control signal and producing the feedback signal with a first frequency determined by the control signal; a first slave voltage-controlled oscillator disposed to receive the control signal and the incoming data, and producing a first clock, the first clock having the first frequency when the incoming data is at a first logic level and being off when the incoming data is at a second logic level; a second slave voltage-controlled oscillator disposed to receive the control signal and the incoming data, and producing a second clock, the second clock having the first frequency when the incoming data is at the second logic level and being off when the incoming data is at the first logic level; and a combiner for combining the first and second clocks to produce the recovered clock. The phase aligner also preferably includes a flip-flop with the incoming data being supplied to a data terminal, the recovered clock being supplied to a clock terminal, and the retimed incoming data being output from an output terminal.

Preferably, the buffer memory associated with the data retiming system associated with the first aspect of the invention includes a storage device including a plurality of storage cells, each of the storage cells storing a predetermined portion of the retimed incoming data in accordance with the recovered clock; a write pointer for pointing to one of the storage cells of the storage device; and a read pointer for pointing to one of the storage cells of the storage device. A predetermined portion of the retimed incoming data is stored to the one of the storage cells pointed to by the write pointer each cycle of the recovered clock, and the stored data is read from one of the storage cells pointed to by the read pointer each cycle of the local clock.

In a second aspect of the invention, a freezeable voltage-controlled oscillator for producing a clock signal in accordance with a freeze signal and a frequency control signal. The freezeable voltage-controlled oscillator includes a plurality of inverters serially coupled to each other, each of the inverters being associated with a stage; a pair of current sources for each of the inverters, each of the current sources being controlled by the frequency control signal; and a first current steering circuit for steering current around the inverter associated with the last stage. The output of the inverter associated with the last stage is frozen at a first potential when the first current steering circuit is activated by the freeze signal. Preferably, the freezeable voltage-controlled oscillator also includes a first clamping circuit for clamping the output of the inverter associated with the last stage to the first potential. Additional current steering and clamping circuits may be provided for other stages of the oscillator. The freezeable voltage-controlled oscillator may be used in the first aspect of the invention for at least one of the slave voltage-controlled oscillators.

Other aspects and advantages of the invention will become apparent from the following detailed description, taken in conjunction with the accompanying drawings, illustrating by way of example the principals of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 3–10. However, those skilled in the art will readily appreciate that the detailed description given herein with respect to these figures is for explanatory purposes as the invention extends beyond these limited embodiments.

Figure 1:
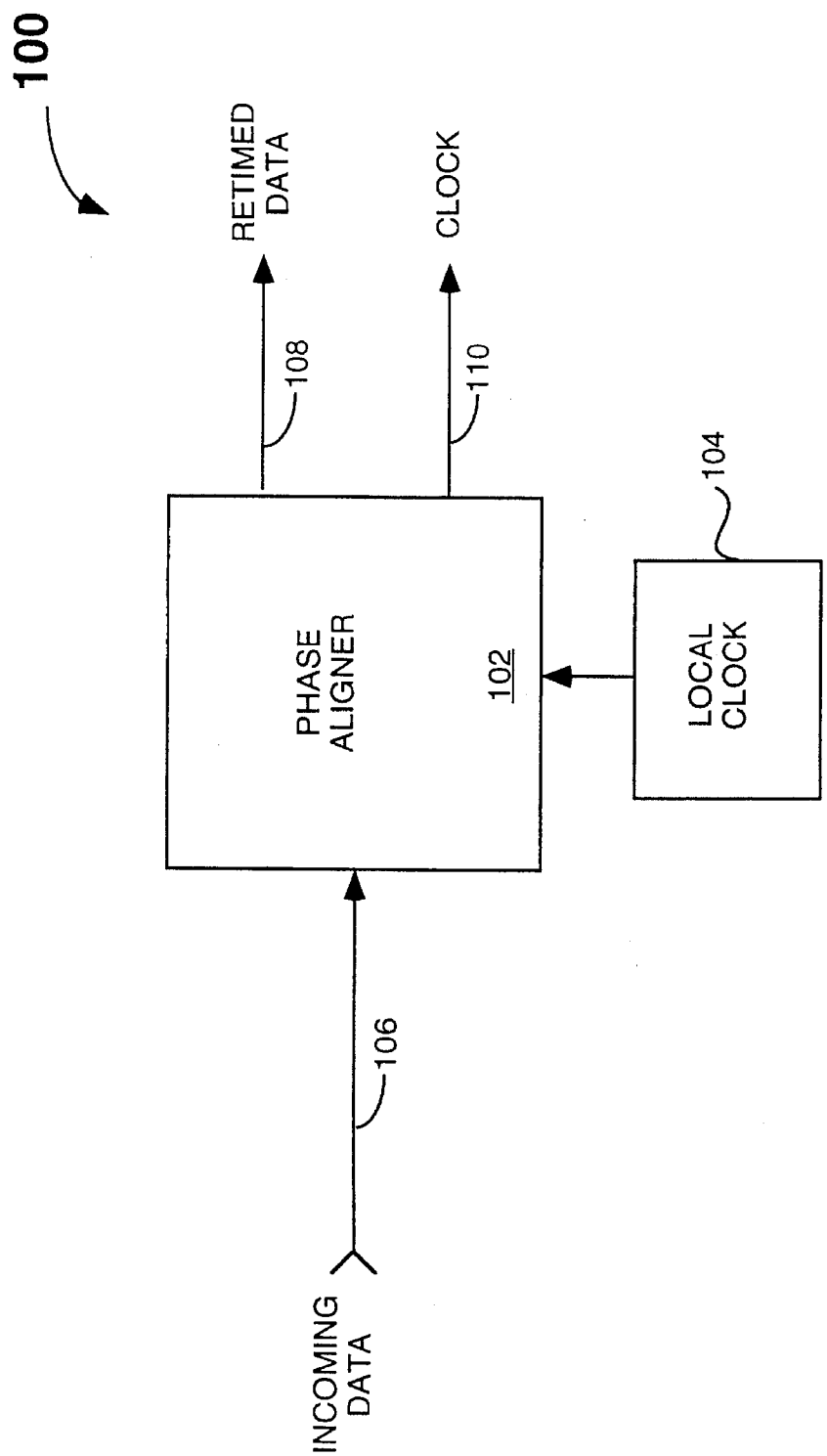
FIG. 1 is a generalized block diagram of a conventional phase aligning system.
Figure 2:
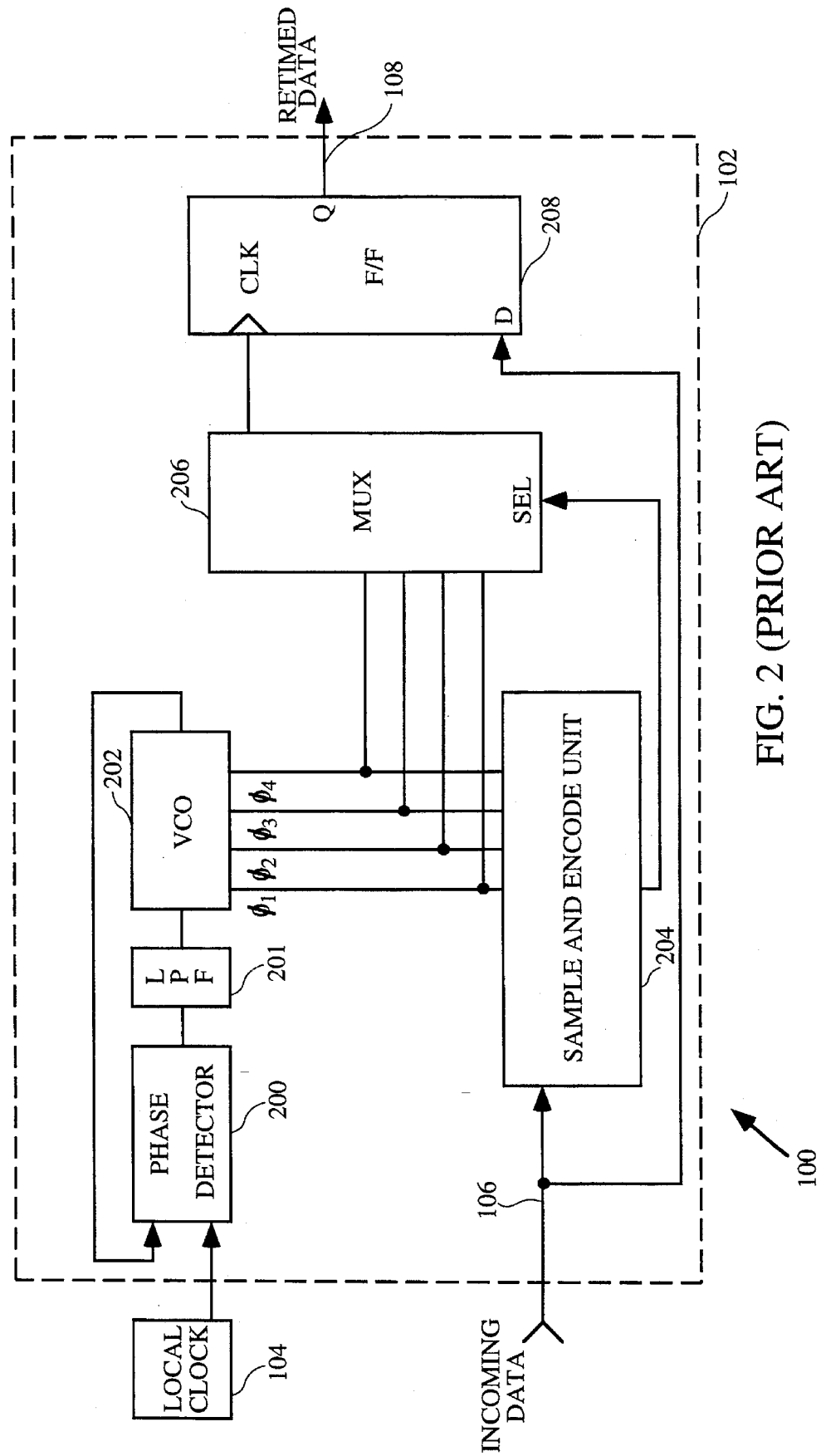
FIG. 2 is a block diagram of a conventional phase aligner.
Figure 3:
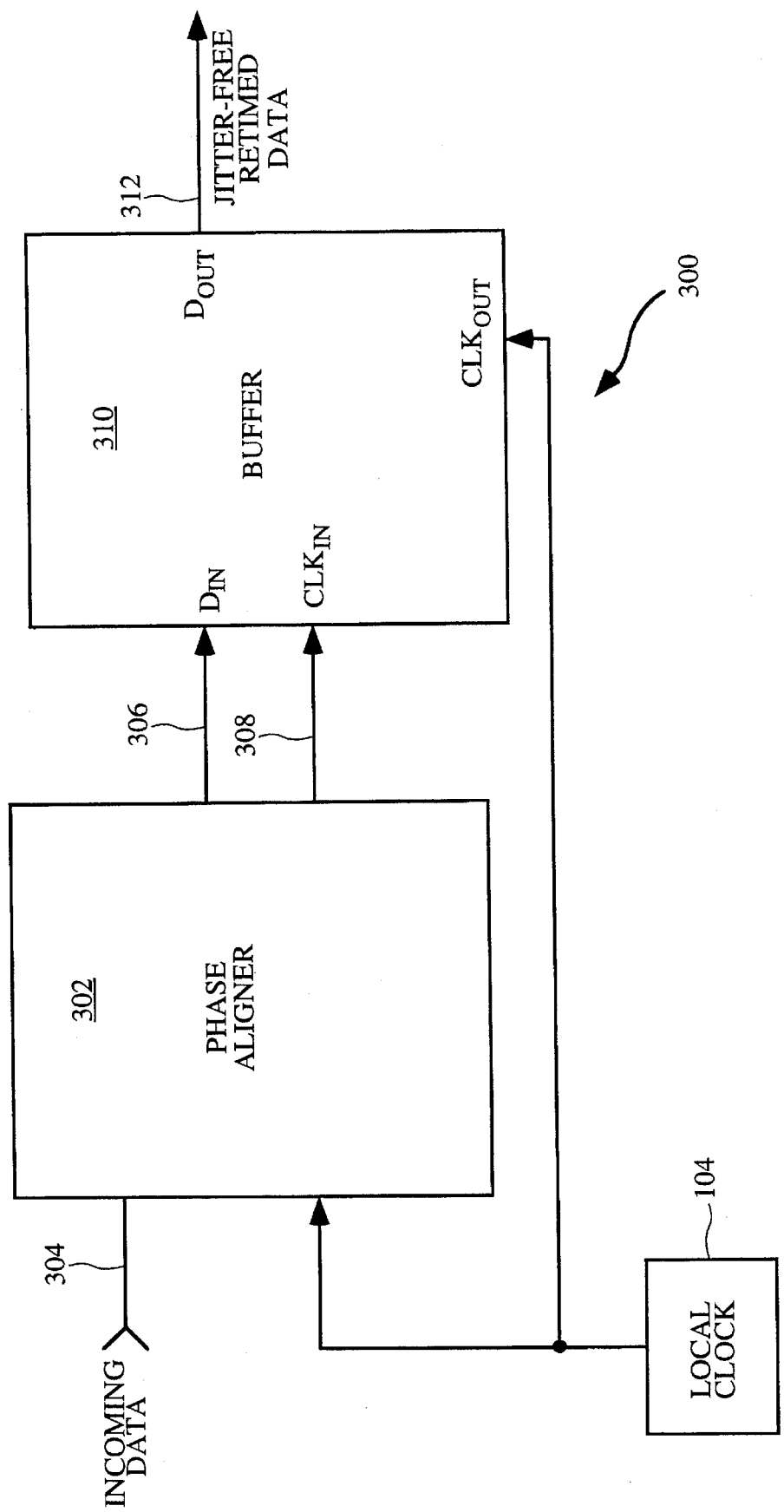
FIG. 3 is a basic block diagram of a phase aligning system in accordance with the invention.

FIG. 3 is a basic block diagram of a phase aligning system 300 in accordance with the invention. The phase aligning system 300 includes a phase aligner 302 which receives incoming data 304 and a local clock 104 and outputs retimed data 306 and a recovered clock 308. The retimed data 306 and the recovered clock 308 output by the phase aligner 302 are supplied to a buffer 310. The buffer 310 is a memory storage device which reads in the retimed data 306 in accordance with the recovered clock 308 and thereafter outputs a jitter-free retimed data 312 in accordance with the local clock 104.

The incoming data 304 is typically, but not necessarily, serial digital data. The incoming data 304 is also usually received at a high transmission rate, e.g., 100 Mhz or higher. In this basic embodiment, the phase aligner 302 operates to recover the recovered clock 308 from the incoming data 304. Once the phase aligner 302 has recovered the recovered clock 308, the incoming data 304 is then retimed with the recovered clock 308 to produce the retimed data 306. The incoming data 304 is retimed with the recovered clock 308 so that the data and clock are in a fixed temporal relationship with one another. Hence, subsequent digital processing can be performed at the destination knowing that the data and the clock are properly aligned relative to each other so that the data when read is stabilized.

However, the retimed data 306 and the recovered clock 308 at this stage still include any jitter contained within the incoming data 304. Typically, the amount of jitter is within plus or minus three (3) unit intervals (or three time periods). The buffer 310 operates to remove the jitter from the retimed data 306 so as to output jitter-free retimed data 312. By clocking the retimed data 306 into the buffer 310 using the recovered clock 308, none of the data is lost due to any jitter associated with in the incoming data 304 because the phase aligner 302 has already ensured that the retimed data 306 and the recovered clock 308 are in a fixed temporal relationship which prevent such loss of data. The retimed data 306 that has been clocked into the buffer 310 (hereafter stored retimed data) is temporarily stored in the buffer 310. Moreover, by clocking the stored retimed data out of the buffer 310 using the local clock 104, the buffer 310 produces the jitter-free retimed data 312 because the local clock 104 is itself jitter-free. Thus, the phase aligning system 300 assures that any jitter, including low frequency jitter, will be eliminated from the retimed data.

Figure 4:
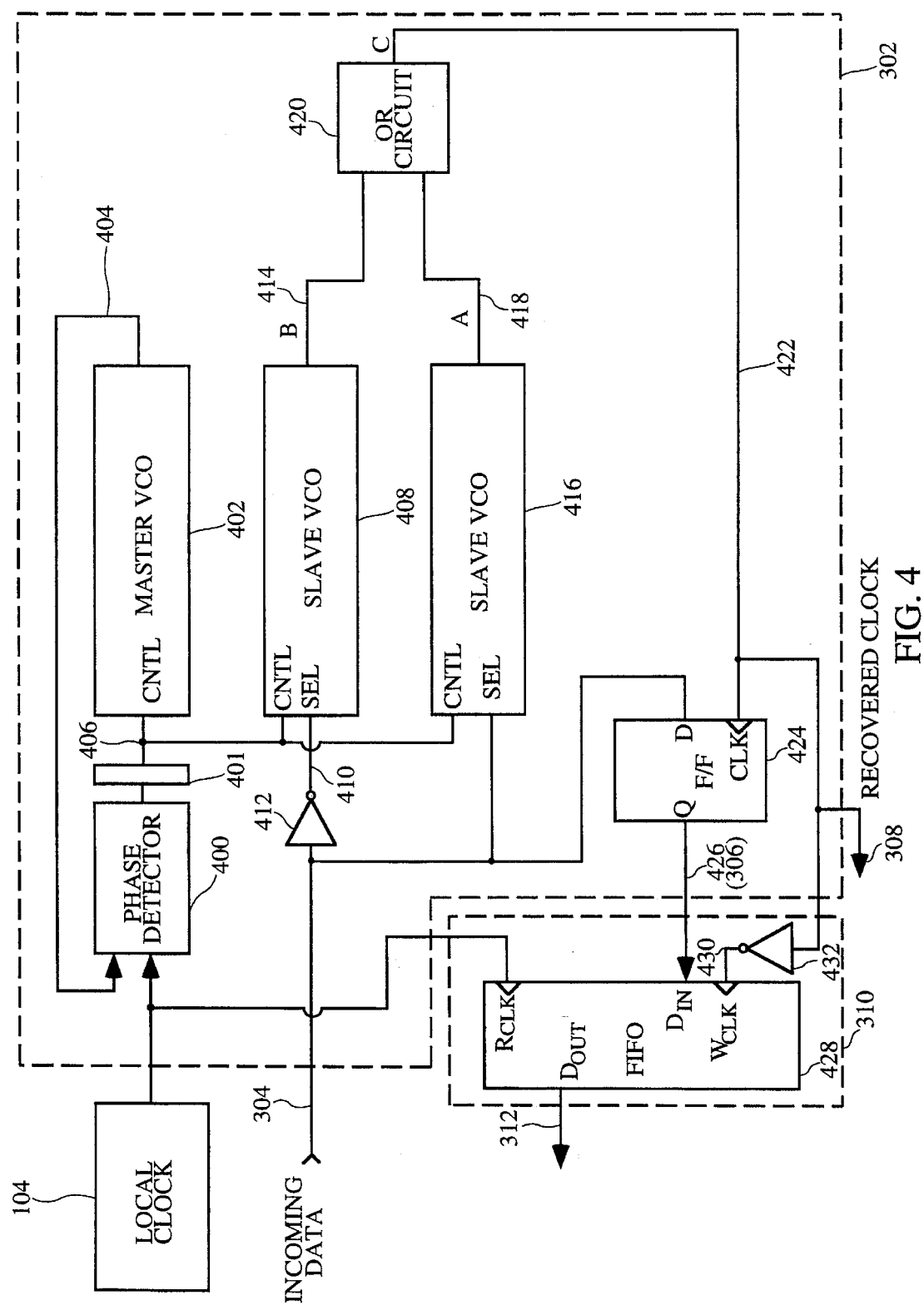
FIG. 4 is a block diagram of a preferred embodiment of the phase aligning system shown in FIG. 3.

FIG. 4 is a block diagram of a preferred embodiment of the phase aligning system 300 shown in FIG. 3. The phase aligner 302 includes a phase detector 400, a low pass filter 401, and a master voltage-controlled oscillator (VCO) 402 which together operate as a phase-locked-loop (PLL). The phase detector 400 receives the local clock 104 and a feedback signal 404 provided by the master VCO 402, compares the difference in their phases, and then outputs a control signal 406. The control signal 406 is then filtered by a low pass filter 401 and supplied to a control input of the master VCO 402 so as to control the frequency of its output signal (which for the master VCO 402 is the feedback signal 404).

The phase aligner 302 also includes a first slave VCO 408 which receives the control signal 406 as well as inverted incoming data 410. The inverted incoming data 410 is produced by an inverter 412 which inverts the incoming data 304. When the inverted incoming data 410 is "high", the first slave VCO 408 outputs a first clock signal (B) 414 which has the same frequency as the local clock 104 because it is controlled by the control signal 406. On the other hand, when the inverted incoming data 410 is "low", the first slave VCO 408 causes the first clock (B) 414 to remain inactive or "low".

The phase aligner 302 also includes a second slave VCO 416 which operates to produce a second clock (A) 418 in accordance with the control signal 406 and the incoming data 304. Namely, when the incoming data 304 is "high", the second slave VCO 416 produces the second clock (A) 418 with the same frequency as the local clock 104. On the other hand, when the incoming data 304 is "low", the second slave VCO 416 causes the second clock (A) 418 to be inactive or "low".

The first and second clocks 414 and 418 are then logically ORed with OR circuit 420 to produce a third clock (C) 422. The third clock (C) 422 is the recovered clock 308 of FIG. 3. The phase aligner 302 also includes a flip-flop 424 which synchronizes or retimes the incoming data 304 with the third clock (C) 422 (recovered clock 308), and outputs retimed data (Q) 426 (306). More particularly, the flip-flop 424 latches the level of the incoming data 304 appearing at the data input D to its output Q on the negative transitions of the third clock (C) 422.

Figure 5:
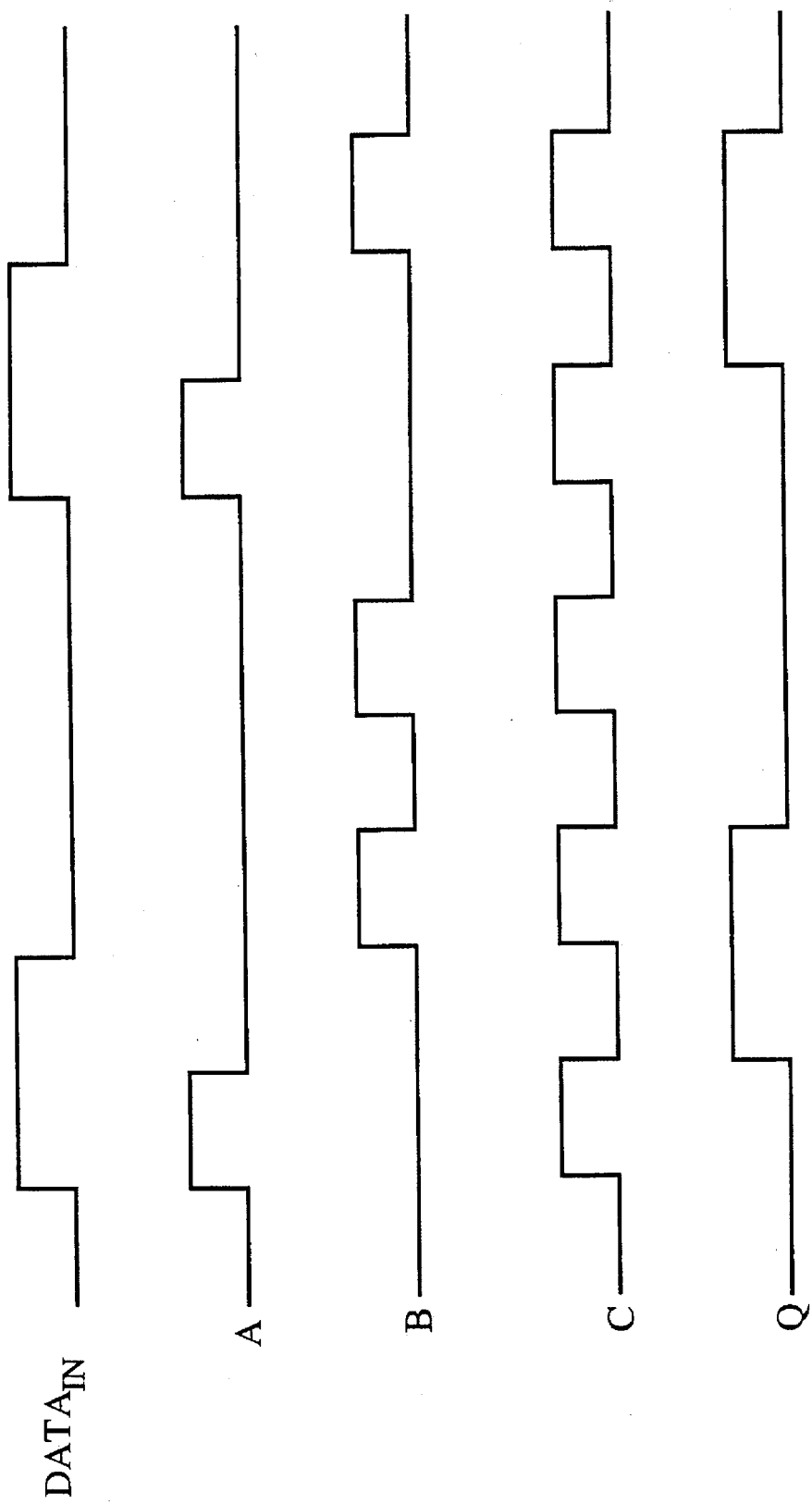
FIG. 5 is a timing diagram for explaining the operation of the phase aligner shown in FIG. 4.

FIG. 5 is a timing diagram for explaining the operation of the phase aligner 302 shown in FIG. 4. The timing diagram illustrates various signals, including the first clock (B) 414 and the second clock (A) 418. As discussed above and illustrated in FIG. 5, the first clock (B) 414 is activated when the incoming data 304 ($DATA_{IN}$) is "low" (i.e., inverted incoming data 410 "high"), and the second clock (A) 418 is active when the incoming data 304 is "high". When activated, the frequency of the first and second clocks 414 and 418 is the same as the frequency of the local clock 104. FIG. 5 also illustrates the third clock (C) 422 which results from combining the first clock (B) 414 and the second clock (A) 418. The retimed data (Q) 426, which is output by the flip-flop 424, illustrated in FIG. 5 is a delayed version of the incoming data 304 ($DATA_{IN}$).

Further, as shown in FIG. 4, the buffer 310 preferably includes a FIFO (first-in-first-out) device 428. The retimed data (Q) 426 is written to the FIFO device 428 using a write clock (WCLK) and data is read from the FIFO device 428 using a read clock (RCLK). In this embodiment, the write clock (WCLK) is an inverted third clock 430 and the read clock (RCLK) is the local clock 104. The inverted third clock 430 is produced by inverting the third clock (C) 422 using inverter 432. The data being written to the FIFO device 428 is the retimed data 426 produced by the phase aligner 302. The data output from the FIFO 428 device is the jitter-free retimed data 312.

Hence, one should note that the third clock (C) 422, which is also the recovered clock 308, is recovered from the incoming data 304 with a high degree of accuracy regardless of jitter existing in the incoming signal 304. Also, because the third clock (C) 422 (the recovered clock 308) includes any jitter that the incoming data 304 had, the incoming data can be retimed without ambiguity (i.e., without loss of data). The third clock (C) 422 (308) and the retimed data (Q) 426 (308) are then in a fixed phase relationship with one another.

Figure 6:
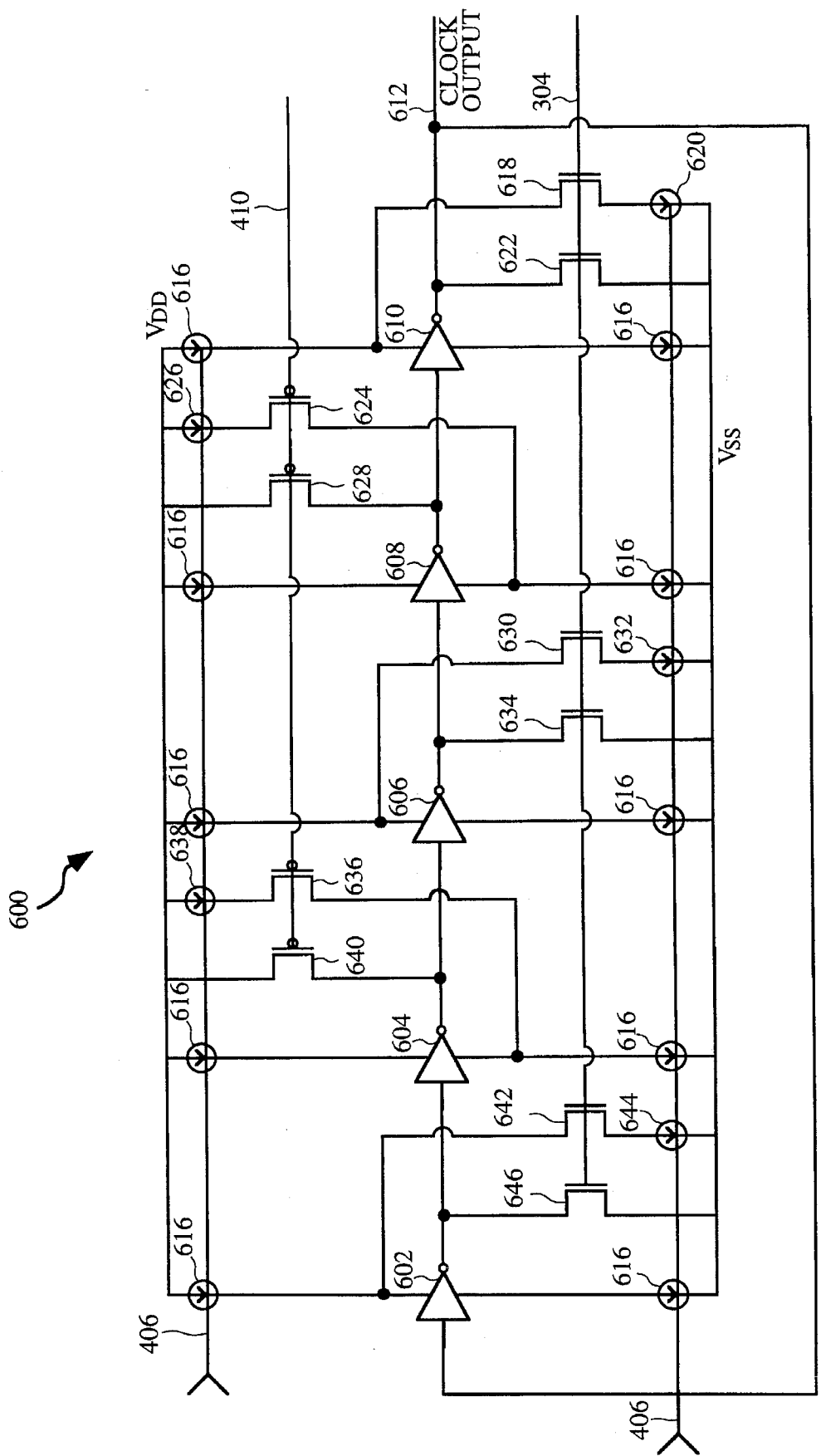
FIG. 6 is a schematic diagram of a master voltage-controlled oscillator (VCO) in accordance with the invention.

FIG. 6 is a schematic diagram of a VCO 600 in accordance with the invention. The VCO 600 is a preferred implementation of the first and second slave VCOs 408 and 416. However, the arrangement shown in FIG. 6 is for the second slave VCO 416. The master VCO 402 can be of a conventional design or may, for manufacturing ease, follow the same design as the first and second slave VCOs 408 and 416.

The VCO 600 is a five-stage oscillator having inverters 602, 604, 606, 608 and 610 which form each of the stages as is conventionally done. The output of the fifth stage is a clock output 612 which is also fed back to the first stage as a feedback signal 614. The inverters 602, 604, 606, 608 and 610 of each stage each receive current from and draw current from current sources 616 as is conventionally known in the art. The frequency of the clock output is controlled by the control signal 406.

Additionally, however, the VCO 600 includes additional circuitry to implement current steering operations within the VCO 600. The current steering operations operate to freeze or hold the output clock 612 to a "low" state. In the fifth stage of the VCO 600, the additional circuitry includes a first field-effect transistor (FET) 618 and a current source 620 are provided to draw all of the current from the associated current source 616 which is coupled between a first voltage source $V_{DD}$ and the inverter 610 when the incoming data 304 is high. The FET 618 and the current source 620 are connected in series between the associated current source 616 coupled to the first voltage source $V_{DD}$ and a second voltage source $V_{SS}$. Here, the current is steered away from the inverter 610 using the FET 618 and the current source 620. The result of steering the current away from the inverter 610 is that the output of the inverter 610 is held or frozen in a low state. In addition, a second FET 622 may be optionally provided to further ensure that the output of inverter 610 will be held low and will transition from high-to-low rapidly. The second FET 622 clamps the output of the inverter 610 to the second voltage source $V_{SS}$. The additional circuitry implementing the current steering operations is controlled by the incoming data 304. When the incoming data 304 is "low", the VCO 600 oscillates in a conventional manner in accordance with the control signal 406. On the other hand, when the incoming data 304 is "high", the output of the inverter 610 (as well as the clock output 612) are held or frozen in a "low" state regardless of the level of the control signal 406.

The current steering operations also operate to preset or freeze the earlier stages of the VCO 600 to the appropriate states such that they are ready when the VCO 600 is activated. In particular, in the fourth stage corresponding to inverter 608, when the output of the fifth stage is held or frozen "low", the output of the inverter 608 will be held or frozen in a "high" state. Here, a FET 624 and current source 626 supply current directly to the current source 616 between the inverter 608 and the second voltage source $V_{SS}$ so that the output of inverter 608 is "high". In this case, the FET 624 and the associated current source 626 supply all the current needed by the current source 616 coupled between the inverter 608 and the second voltage source $V_{SS}$. For further assurance, a FET 628 may be provided between the first voltage source $V_{DD}$ and the output of the inverter 608. The FET 628 operates to clamp the output of the inverter 608 to the first voltage source $V_{DD}$.

It follows that the outputs of the first, second and third stages of the VCO 600 may be held or frozen the same way. The third stage uses a FET 630 and a current source 632 for current steering, and a FET 634 for clamping. The second stage uses a FET 636 and a current source 638 for current steering, and a FET 640 for clamping. The first stage uses a FET 642 and a current source 644 for current steering, and a FET 646 for clamping. However, it may be preferable for gate minimizing reasons to provide these additional gates and current sources associated with the current steering operations for only the last two stages of the VCO 600.

Figure 7:
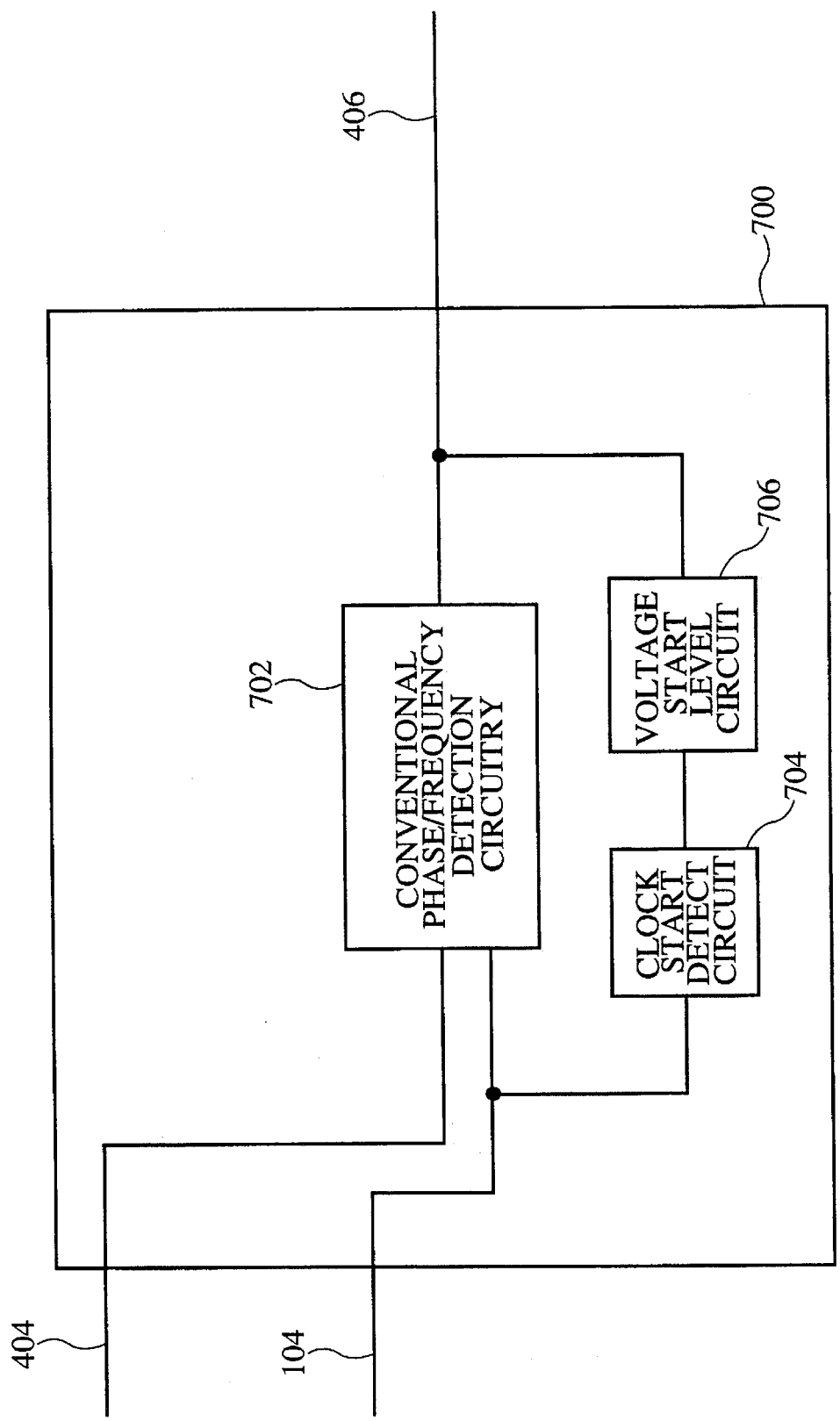
FIG. 7 is a block diagram of a phase detector in accordance with the invention.

FIG. 7 is a block diagram of a phase detector 700 in accordance with the invention. The phase detector 700 is a preferred implementation of the phase detector 400 illustrated in FIG. 4. In FIG. 7, the phase detector 700 includes conventional phase/frequency detection circuitry 702 which produces the control signal 406 based on the phase/frequency difference between the local clock 104 and the feedback signal 404. Such phase/frequency detection circuitry is well known in the art. The phase detector 700 also includes a clock start detect circuit 704 and a voltage start level circuit 706. The clock start detect circuit 704 determines when the local clock 104 has been enabled or activated for phase aligning. For example, when the local clock 104 is initially enabled or activated, a one-shot circuit can produce a pulse indicating the detection of the start of the local clock 104. The voltage start level circuit 706 then clamps a predetermined voltage to the control signal 406 at power-up. The predetermined voltage is selected based on the voltage on the control signal 406 normally needed for the PLL to lock to the local clock 104. For example, the voltage start level circuit 706 preferably uses a transfer switch to couple a voltage signal of fifty-percent (50%) of $V_{DD}$ onto the control signal 406 at power-up. The fifty-percent of $V_{DD}$ can be obtained with a voltage divider using two resisters. After the detection of the presence of the local clock 104, the transfer switch decouples the predetermined voltage from the control signal 406 and the control signal 406 is produced by the conventional phase/frequency detection circuitry 702. The advantage of using the additional circuitry (clock start detect circuit 704 and the voltage start level circuit 706) is that the master VCO 402 (FIG. 4) (i.e., the PLL) is able to start up such that it is close to being locked with the local clock 104. This enables the PLL to lock very rapidly and thereby enable data to be retimed by the phase aligning system 300 relatively soon (e.g., 12 microseconds) after enabling or activating the local clock 104.

Figure 8:
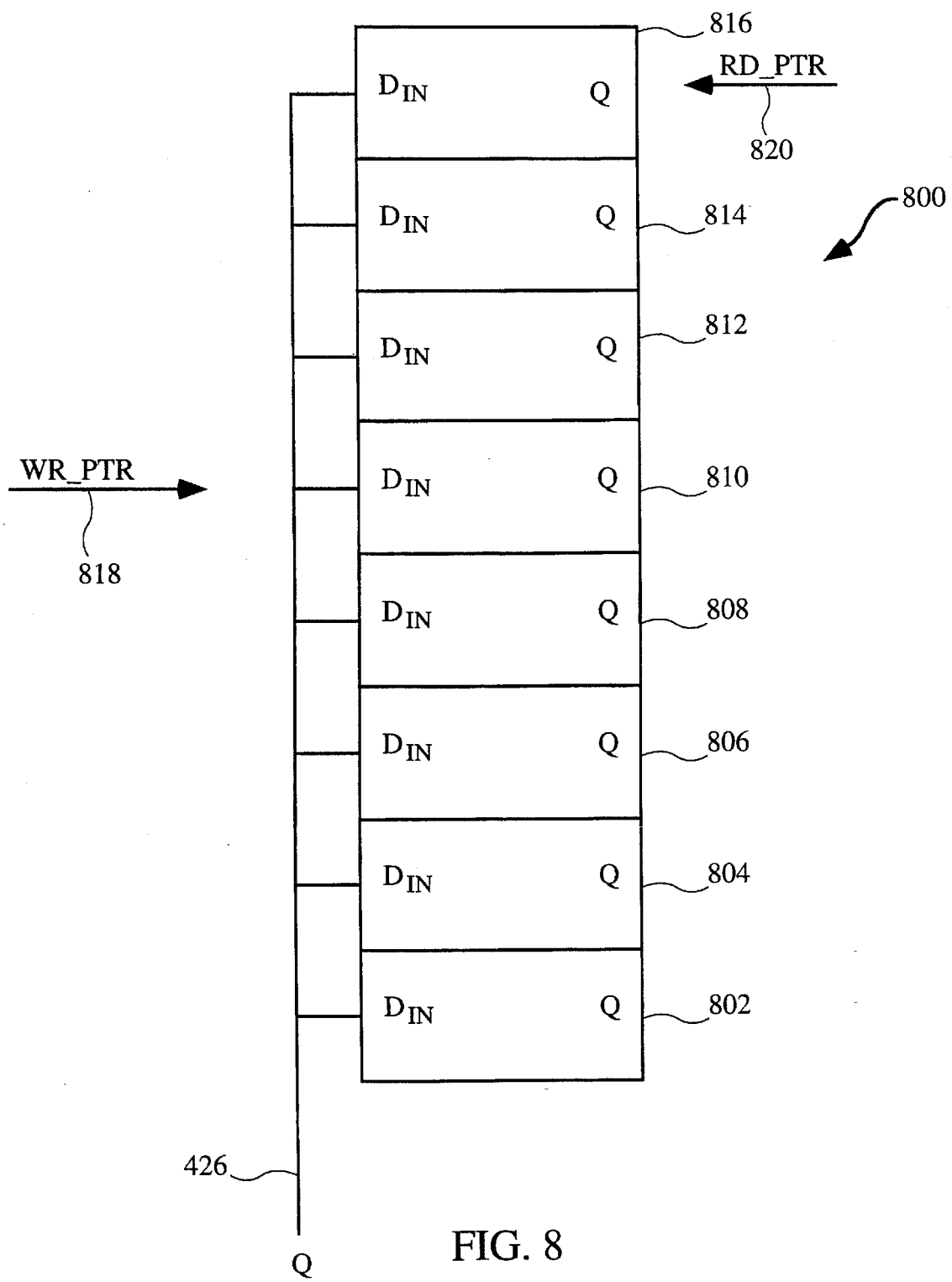
FIG. 8 is a block diagram of a FIFO device in accordance with the invention.

FIG. 8 is a block diagram of a FIFO device 800 according to the invention. The FIFO device 800 is an implementation of the FIFO device 428 illustrated in FIG. 4. The FIFO device 800 includes eight (8) storage cells 802–816. The storage cells 802–816 are preferably flip-flops. The data input or data to be stored to the storage cells 802–816 is the retimed data (Q) 426. A write pointer (WR_PTR) 818 is used to select one of the storage cells 802–816 in which the retimed data (Q) 426 is to be stored. The retimed data (Q) 426 is stored to the selected one of the storage cells in accordance with the inverted recovered clock 430. A read pointer (RD_PTR) 820 is used to select one of the storage cells 802–816 from which to read the data stored therein. The stored data read out from the selected one of the storage cells 802–816 is the jitter-free retimed data 312.

When jitter is present in the incoming data 304 (and likewise in the retimed data 426), the jitter up to a predetermined amount is removed by the FIFO device 800. In this embodiment, the maximum amount of jitter that the FIFO device 800 can remove is plus or minus three (3) unit intervals.

In the preferred implementation, both the read and the write pointers circulate around the storage cells 802–816. Assuming that the read and write pointers 820 and 818 are initially at the location shown in FIG. 8, after one clock cycle of the local clock 104, the read pointer (RD_PTR) 820 would move to point to the storage cell 814. Then, on the next clock cycle of the local clock 104, the read pointer (RD_PTR) 820 would move to point to the storage cell 812. On the clock cycle of the local clock 104 after the read pointer (RD_PTR) 820 points to the storage cell 802, the read pointer (RD_PTR) 820 moves back to the top of the FIFO device 800 to point to storage cell 816. Hence, with every clock cycle of the local clock 104, the read pointer (RD_PTR) 820 would move to point to the next storage cell in a circular fashion. The movement of the write pointer (WR_PTR) 818 is similar, except that it is allowed to initially advance to a position about in the middle of the FIFO device (e.g., storage cell 810) and that it moves based on clock cycles of the inverted recovered clock 430.

If there is no jitter present, the write pointer (WR_PTR) 818 and the read pointer (RD_PTR) 820 move to the next respective storage cells an essentially synchronous manner. Namely, in this implementation, the read pointer (RD_PTR) 820 would always lag the write pointer (WR_PTR) 818 by three storage cells. Each storage cell is associated with an unit intervals.

On the other hand, when jitter is present, the respective rate with which the read and write pointers 820 and 818 move are different. For example, in a first case of a one unit interval jitter, where the data arrives faster then it should, the write pointer (WR_PTR) 818 would be separated from the read pointer (RD_PTR) 820 by four storage cells. In a second case of one unit interval jitter, where the data is written slower than it should, then write pointer (WR_PTR) 818 would be separated from the read pointer (RD_PTR) 820 by two storage cells. Hence, the separation of the write pointer (WR_PTR) 818 and the read pointer (RD_PTR) 820 varies with the jitter amount. In this implementation, the maximum jitter that the FIFO device 800 can handle is four unit interval if data is arriving too fast and three unit intervals if the data is arriving too slow.

Figure 9:
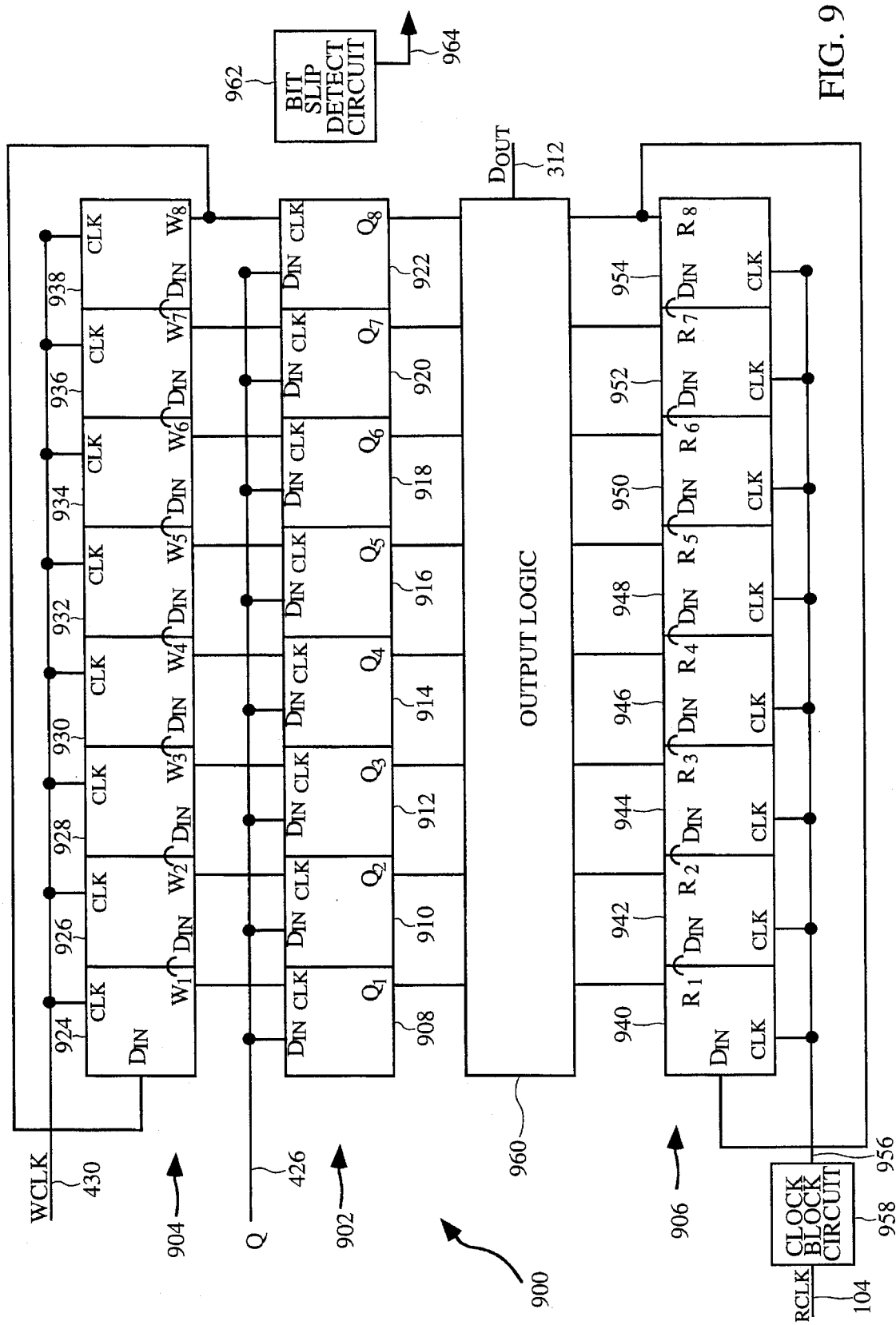
FIG. 9 is a schematic diagram of a preferred implementation of a FIFO device according to the invention.

FIG. 9 is a schematic diagram of a FIFO device 900 according to an embodiment of the invention. The FIFO device 900 is a preferred implementation of the FIFO device 428. The FIFO device 900 includes a storage device 902, a write pointer device 904 and a read pointer device 906. The storage device 902 includes storage cells 908–922. Preferably, each of the storage cells 908–922 is a D-type flip-flop. The data to be stored in the storage cells 908–922 is the retimed data (Q) 426. The write pointer device 904 includes storage cells 924–938. The write pointer device 904 operates to select the one of the storage cells 908–922 in which the retimed data (Q) 426 is to stored. The write pointer device 904 is preferably a shift register that is clock by a write clock (WCLK). The write clock (WCLK) is the inverted recovered clock 430. Upon reset of the phase aligning system 300, the write pointer device 904 is preset such that the output (W1) of the first storage cell 924 is "high" and the outputs (W2–W8) of the remaining storage cells 926–938 are "low". Thereafter, as the write clock (WCLK) transitions, the outputs (W1–W8) of the storage cells 924–938 shift to the next storage cell 926–938 in a circular fashion. The outputs (W1–W8) of the storage cells 924–938 of the write pointer device 904 are respectively coupled to clock inputs of the storage cells 908–922 of the storage device 902. Accordingly, as the write clock (WCLK) causes the output of one of the storage cells (W1–W8) to become "high", the activated storage cell of the write pointer device 904 is the pointer that causes the retimed data (Q) 426 to be stored in the corresponding one of the storage cells of the storage device 902. For example, if output W3 of the write pointer device 904 is "high" and the other outputs W1, W2, W4–W8 are "low", then the data value of the retimed data (Q) 426 is stored to the storage cell 912 of the storage device 902. As a result, the output Q3 of the storage cell 912 is adjusted in accordance with the newly stored data value, while the other outputs Q1, Q2, Q4–Q8 of the storage device 902 are not changed.

The read pointer device 906 operates to read one of the outputs (Q1–Q8) of the storage device 902. The read pointer device 906 includes storage cells 940–954. The read pointer device 906 is preferably a shift register that is clocked by a modified read clock 956. A clock block circuit 958 modifies a read clock (RCLK) to produce the modified read clock 956. The read clock (RCLK) is the local clock 104. The modified read clock 956 is the read clock (RCLK) with a predetermined number of initial transitions suppressed. Here, in this implementation, the clock block circuit 958 blocks the first three transitions of the read clock, but thereafter passes the read clock (RCLK) to the storage cells 940–954. The reason for blocking the predetermined number of initial transitions of the read clock (RCLK) is to allow the write clock (WCLK) to advance to cause the write pointer device 904 (storage cell 930) to point to storage cell 914 of the storage device 902. By advancing the write pointer in this manner, the FIFO device 900 is able to absorb and remove the jitter in the retimed data 426. The outputs (R1–R8) of the storage cells 940–954 of the read pointer device 906 are respectively associated with the storage cells 908–922 of the storage device 902. Upon reset of the phase aligning system 300, the read pointer device 906 is preset such that the output (R1) of the first storage cell 940 is "high" and the outputs (R2–R8) of the remaining storage cells 942–954 are "low". Thereafter, as the modified read clock 956 transitions, the outputs (R1–R8) of the storage cells 940–954 shift to the next storage cell 940–954 in a circular fashion.

The FIFO device 900 also includes output logic 960 coupled between the storage device 902 and the read pointer device 906. As the "high" in the read pointer device 906 moves, the particular one of the outputs Q1–Q8 from the storage cells 908–922 being pointed to by the read pointer device 906 is serially placed on the Dout line from the output logic 960. The data being placed on the Dout line forms the jitter-free retimed data 312.

In addition, the FIFO device (or phase aligning system) may also include a bit slip detect circuit 962 which produces an error signal 964 when the amount of jitter is too much for the phase aligning system 300 to absorb. The bit slip detect circuit 962 includes convention logic to determine if the read pointer and the write pointer simultaneously point to the same storage cell of the storage device 902. When the read and write pointer are so aligned, the jitter is too great for the phase aligning system 300.

Figure 10:
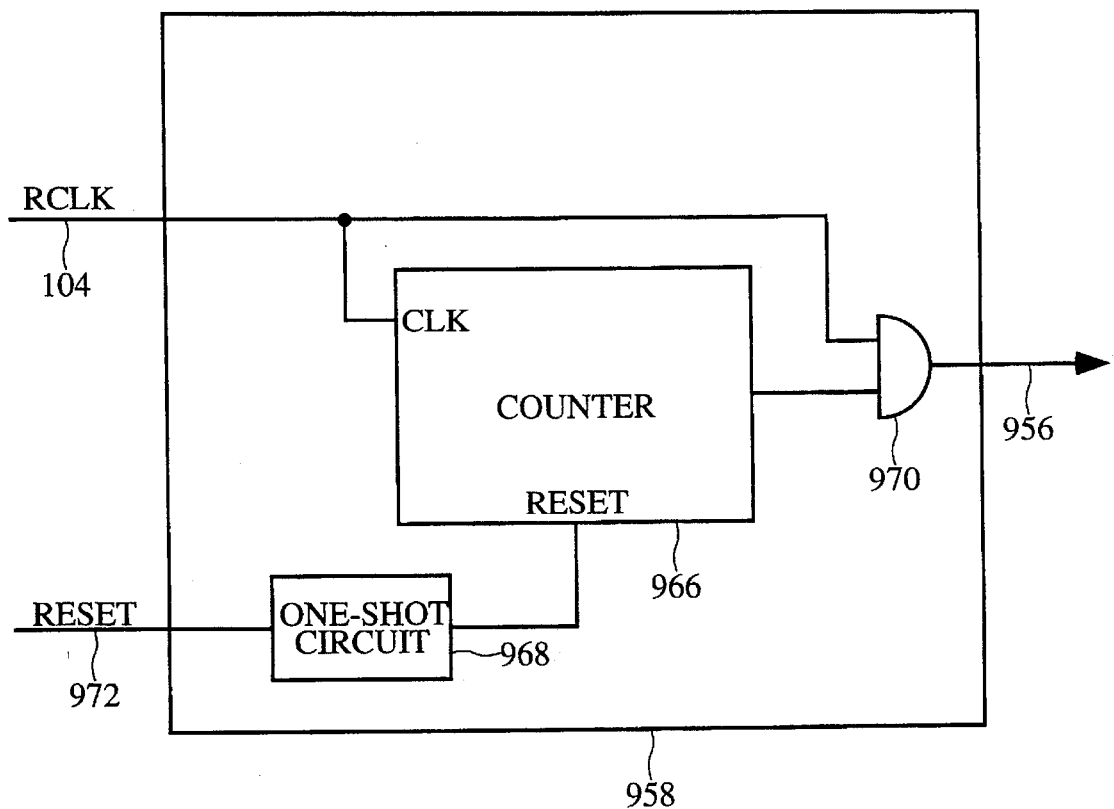
FIG. 10 is a block diagram of a preferred implementation of a clock block circuit according to the invention.

FIG. 10 is a block diagram of a preferred implementation of the clock block circuit 958 shown in FIG. 9. The clock block circuit 958 includes a counter 966, a one-shot circuit 968 and an AND gate 970. Upon receiving a reset signal (RESET) 972 which can be generated when the first input data transition occurs, the one-shot circuit 968 produces a pulse which resets the counter 966. Thereafter, as the read clock (RCLK) 104 transitions, the counter is incremented but its output is held "low" until a predetermined count value is reached. Once the counter 966 reaches the predetermined count value, the output of the counter 966 go "high" and thereby enables the read clock (RCLK) to pass through the AND gate 970. The output of the AND gate 970 is the modified read clock 956. For the embodiment of the FIFO device 900 shown in FIG. 9, the predetermined count value is four (4).

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A data retiming system for retiming incoming data, comprising:

a local clock;

a phase aligner for receiving the incoming data and producing a recovered clock from the incoming data, and then producing retimed incoming data by retiming the incoming data with the recovered clock; and a buffer memory, operatively connected to said local clock and said phase aligner, for removing jitter from the retimed incoming data by storing the retimed incoming data in accordance with the recovered clock and reading the stored data in accordance with the local clock.

2. A data retiming system as recited in claim 1, wherein said phase aligner comprises:

a first controlled oscillator disposed to receive a control signal and the incoming data, and producing a first clock, the first clock having a first frequency when the incoming data is at a first logic level and being off when the incoming data is at a second logic level;

a second controlled oscillator disposed to receive the control signal and the incoming data, and producing a second clock, the second clock having the first frequency when the incoming data is at the second logic level and being off when the incoming data is at the first logic level; and a combiner for combining the first and second clocks to produce the recovered clock.

3. A data retiming system as recited in claim 2, wherein said phase aligner further comprises a flip-flop for retiming the incoming data in accordance with the recovered clock.

4. A data retiming system as recited in claim 1, wherein said buffer memory is a FIFO device.

5. A data retiming system as recited in claim 1, wherein said phase aligner comprises:

means for producing the recovered clock; and means for retiming the incoming data with the recovered clock signal.

6. A data retiming system as recited in claim 1, wherein said phase aligner comprises:

a clock recovery circuit for producing the recovered clock; and a data retiming circuit for retiming the incoming data with the recovered clock signal.

7. A data retiming system as recited in claim 6, wherein said clock recovery circuit comprises:

a phase detector for comparing the local clock with a feedback signal and producing a control signal based on the comparison;

a master voltage-controlled oscillator, operatively connected to said phase detector, for receiving the control signal and producing the feedback signal with a first frequency determined by the control signal;

a first slave voltage-controlled oscillator disposed to receive the control signal and the incoming data, and producing a first clock, the first clock having the first frequency when the incoming data is at a first logic level and being off when the incoming data is at a second logic level;

a second slave voltage-controlled oscillator disposed to receive the control signal and the incoming data, and producing a second clock, the second clock having the first frequency when the incoming data is at the second logic level and being off when the incoming data is at the first logic level; and a combiner for combining the first and second clocks to produce the recovered clock.

8. A data retiming system as recited in claim 7, wherein said data retiming circuit comprises a flip-flop, said flip-flop having a data terminal, a clock terminal and an output terminal, the incoming data being supplied to the data terminal, the recovered clock being supplied to the clock terminal, and the retimed incoming data being output from the output terminal.

9. A data retiming system as recited in claim 7, wherein said phase detector comprises:

preset circuitry for presetting the value of the control signal produced by said phase detector upon start-up of the local clock.

10. A data retiming system as recited in claim 1, wherein said phase aligner comprises:

a phase detector for comparing the local clock with a feedback signal and producing a control signal based on the comparison;

a master voltage-controlled oscillator, operatively connected to said phase detector, for receiving the control signal and producing the feedback signal with a first frequency determined by the control signal;

an inverter for inverting the incoming data to produce inverted incoming data;

a first voltage-controlled oscillator, operatively connected to said phase detector, for receiving the control signal and the inverted incoming data, and producing a first clock, the first clock having the first frequency when the inverted incoming data is high and being off when the inverted incoming data is low;

a second voltage-controlled oscillator, operatively connected to said phase detector, for receiving the control signal and the incoming data, and producing a second clock, the second clock having the first frequency when the incoming data is high and being off when the incoming data is low;

an OR gate for logical ORing the first and second clocks to produce the recovered clock; and a flip-flop for retiming the incoming data in accordance with the recovered clock.

11. A data retiming system as recited in claim 1, wherein the incoming data is digital data.

12. A data retiming system as recited in claim 1, wherein said buffer memory comprises:

a storage device including a plurality of storage cells, each of the storage cells storing a predetermined portion of the retimed incoming data in accordance with the recovered clock;

a write pointer for pointing to one of the storage cells of said storage device; and a read pointer for pointing to one of the storage cells of said storage device.

13. A data retiming system as recited in claim 12, wherein a predetermined portion of the retimed incoming data is stored to the one of the storage cells pointed to by said write pointer each cycle of the recovered clock, and wherein the stored data is read from one of the storage cells pointed to by said read pointer each cycle of the local clock.

14. A data retiming system as recited in claim 12, wherein each of the storage cells of said buffer memory are flip-flops, and wherein the predetermined portion is one-bit.

15. A data retiming system as recited in claim 12, wherein said write pointer comprises a first shift register device, and wherein said read pointer comprises a second shift register device.

16. A data retiming system as recited in claim 12, wherein the stored data read from the storage cell pointed to by said read pointer is output by said buffer memory.

17. A data retiming system as recited in claim 12, wherein at start-up, said read pointer is disabled for an initial period of a predetermined number of clock cycles of the local clock so that a predetermined number of the portions of the retimed incoming data can be stored to certain of the storage cells of said storage device before the stored data begins to be read via said read pointer.

18. A data retiming system as recited in claim 12, wherein at start-up, a clock block circuit disables said read pointer for an initial time period so that a predetermined number of the portions of the retimed incoming data can be stored to certain of the storage cells of said storage device before the stored data begins to be read via said read pointer.

19. A data retiming system as recited in claim 12, wherein said data retiming system also removes jitter from the incoming data,
wherein said data retiming system further comprises:
an excessive jitter detect circuit for determining whether jitter in the incoming data is too excessive for said data retiming system to remove.

20. A data retiming system as recited in claim 19, wherein said excessive jitter detect circuit determines that the jitter in the incoming data is too excessive for said data retiming system to remove by comparing said read pointer with said write pointer.

21. A data retiming system for retiming incoming data, comprising:
a local clock;
a phase aligner for receiving the incoming data and producing a recovered clock from the incoming data, and then producing retimed incoming data by retiming the incoming data with the recovered clock, said phase aligner including at least
a first controlled oscillator disposed to receive a control signal and the incoming data, and producing a first clock, the first clock having a first frequency when the incoming data is at a first logic level and being off when the incoming data is at a second logic level;
a second controlled oscillator disposed to receive the control signal and the incoming data, and producing a second clock, the second clock having the first frequency when the incoming data is at the second logic level and being off when the incoming data is at the first logic level; and
a combiner for combining the first and second clocks to produce the recovered clock; and
a buffer memory, operatively connected to said local clock and said phase aligner, for removing jitter from the retimed incoming data by storing the retimed incoming data in accordance with the recovered clock and reading the stored data in accordance with the local clock, and
wherein said first controlled oscillator comprises:
multiple stages of inverters between an input terminal and an output terminal;
a pair of current sources for each of the inverters, the inverter being coupled between said pair of current sources associated therewith; and
at least one of said stages having a current steering circuit for steering current around the inverter associated with said stage.

22. A data retiming system as recited in claim 21, wherein said at least one of said stages further comprising a clamping device for clamping the output of the respective inverter to a fixed potential.

23. A data retiming system as recited in claim 21, wherein said at least one of said stages is the last stage of said multiple stages.

24. A data retiming system for retiming incoming data, comprising:
a local clock;
a phase aligner for receiving the incoming data and producing a recovered clock from the incoming data, and then producing retimed incoming data by retiming the incoming data with the recovered clock, said phase aligner including at least
a first controlled oscillator disposed to receive a control signal and the incoming data, and producing a first clock, the first clock having a first frequency when the incoming data is at a first logic level and being off when the incoming data is at a second logic level;
a second controlled oscillator disposed to receive the control signal and the incoming data, and producing a second clock, the second clock having the first frequency when the incoming data is at the second logic level and being off when the incoming data is at the first logic level; and
a combiner for combining the first and second clocks to produce the recovered clock; and
a buffer memory, operatively connected to said local clock and said phase aligner, for removing jitter from the retimed incoming data by storing the retimed incoming data in accordance with the recovered clock and reading the stored data in accordance with the local clock, and
wherein said first controlled oscillator comprises:
multiple stages of inverters between an input terminal and an output terminal;
a pair of current sources for each of the inverters, the inverter being coupled between said pair of current sources associated therewith;
a first current steering circuit, operatively connected to the inverter associated with the last stage, for steering current around the inverter associated with the last stage, thereby freezing the output of the inverter in a low state; and
a second current steering circuit, operatively connected to the inverter associated with the next to last stage, for steering current around the inverter associated with the next to last stage, thereby freezing the output of the inverter in a high state.

25. A data retiming system as recited in claim 24, wherein said first controlled oscillator further comprises:
a first clamping circuit, operatively connected to the inverter associated with the last stage, for clamping the output of the inverter associated with the last stage to a first fixed potential; and
a second clamping circuit, operatively connected to the inverter associated with the next to last stage, for clamping the output of the inverter associated with the next to last stage to a second fixed potential.

26. A data retiming system for retiming incoming digital data, comprising:
a local clock;

a phase aligner for receiving the incoming data and producing a recovered clock from the incoming data, and then producing retimed incoming data by retiming the incoming data with the recovered clock, said phase aligner including at least:
  a phase detector for comparing the local clock with a feedback signal and producing a control signal based on the comparison;
  a master voltage-controlled oscillator, operatively connected to said phase detector, for receiving the control signal and producing the feedback signal with a first frequency determined by the control signal;
  a first slave voltage-controlled oscillator disposed to receive the control signal and the incoming data, and producing a first clock, the first clock having the first frequency when the incoming data is at a first logic level and being off when the incoming data is at a second logic level;
  a second slave voltage-controlled oscillator disposed to receive the control signal and the incoming data, and producing a second clock, the second clock having the first frequency when the incoming data is at the second logic level and being off when the incoming data is at the first logic level;
  a combiner for combining the first and second clocks to produce the recovered clock; and
  a flip-flop having a data terminal, a clock terminal and an output terminal, the incoming data being supplied to the data terminal, the recovered clock being supplied to the clock terminal, and the retimed incoming data being output from the output terminal; and
a buffer memory, operatively connected to said local clock, said combiner and said flip-flop, for removing jitter from the retimed incoming data by storing the retimed incoming data in accordance with the recovered clock and reading the stored data in accordance with the local clock.

27. A data retiming system as recited in claim 26, wherein said buffer memory comprises:
  a storage device including a plurality of storage cells, each of the storage cells storing a predetermined portion of the retimed incoming data in accordance with the recovered clock;
  a write pointer for pointing to one of the storage cells of said storage device; and
  a read pointer for pointing to one of the storage cells of said storage device,
wherein a predetermined portion of the retimed incoming data is stored to the one of the storage cells pointed to by said write pointer each cycle of the recovered clock, and
wherein the stored data is read from one of the storage cells pointed to by said read pointer each cycle of the local clock.

28. A data retiming system for retiming incoming data, comprising:
  a local clock;
  means for receiving the incoming data and producing a recovered clock from the incoming data, and then producing retimed incoming data by retiming the incoming data with the recovered clock; and
  means for removing jitter from the retimed incoming data by storing the retimed incoming data in accordance with the recovered clock and reading the stored data in accordance with the local clock.

29. A freezeable voltage-controlled oscillator for producing a clock signal in accordance with a freeze signal and a frequency control signal, comprising:
  a plurality of inverters serially coupled to each other, each of said inverters being associated with a stage;
  a pair of current sources for each of said inverters, each of said current sources being controlled by the frequency control signal; and
  a first current steering circuit for steering current around the inverter associated with the last stage,
  wherein the output of the inverter associated with the last stage is frozen at a first potential when said first current steering circuit is activated by the freeze signal.

30. A freezeable voltage-controlled oscillator as recited in claim 29, wherein said oscillator further comprises:
  a first clamping circuit, operatively connected to said inverter associated with the last stage, for clamping the output of said inverter associated with the last stage to the first potential.

31. A freezeable voltage-controlled oscillator as recited in claim 29,
  wherein said oscillator further comprises:
    a second current steering circuit for steering current around said inverter associated with the next to last stage, and
  wherein the output of said inverter associated with the next to last stage is frozen at a second potential when said second current steering circuit is activated by the freeze signal, the second potential being different than the first potential.

32. A freezeable voltage-controlled oscillator as recited in claim 31, wherein said oscillator further comprises:
  a first clamping circuit, operatively connected to said inverter associated with the last stage, for clamping the output of said inverter associated with the last stage to the first potential; and
  a second clamping circuit, operatively connected to said inverter associated with the next to last stage, for clamping the output of said inverter associated with the next to last stage to the second potential.

* * * * *